United States Patent
Sonoda et al.

(10) Patent No.: US 8,741,161 B2
(45) Date of Patent: Jun. 3, 2014

(54) METHOD OF MANUFACTURING SEMICONDUCTOR DEVICE

(75) Inventors: Yasuyuki Sonoda, Yokohama (JP); Kyoichi Suguro, Yokohama (JP); Masatoshi Yoshikawa, Yokohama (JP); Koji Yamakawa, Tokyo (JP); Katsuaki Natori, Yokohama (JP); Daisuke Ikeno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 13/428,535

(22) Filed: Mar. 23, 2012

(65) Prior Publication Data

US 2013/0005148 A1 Jan. 3, 2013

(30) Foreign Application Priority Data

Jun. 30, 2011 (JP) ................................. 2011-146577

(51) Int. Cl.
*H01L 21/302* (2006.01)

(52) U.S. Cl.
USPC .................. 216/38; 216/88; 216/95; 438/10; 438/692; 438/735; 438/744; 438/778; 427/527; 204/192.34

(58) Field of Classification Search
None
See application file for complete search history.

(56) References Cited

U.S. PATENT DOCUMENTS

| | | | | |
|---|---|---|---|---|
| 6,610,573 B2 * | 8/2003 | Weis | | 438/268 |
| 7,709,344 B2 * | 5/2010 | Chen et al. | | 438/401 |
| 2005/0003668 A1 * | 1/2005 | Hung et al. | | 438/691 |
| 2010/0072173 A1 * | 3/2010 | Hautala | | 216/94 |
| 2010/0200946 A1 * | 8/2010 | Hautala | | 257/506 |
| 2011/0312180 A1 * | 12/2011 | Wang | | 438/692 |
| 2012/0064715 A1 * | 3/2012 | Lin et al. | | 438/663 |

FOREIGN PATENT DOCUMENTS

| | | |
|---|---|---|
| JP | 05-206120 | 8/1993 |
| JP | 2007-059927 | 3/2007 |
| JP | 2010-186869 | 8/2010 |

* cited by examiner

*Primary Examiner* — Anita Alanko

(74) *Attorney, Agent, or Firm* — Finnegan, Henderson, Farabow, Garrett & Dunner, LLP

(57) ABSTRACT

According to one embodiment, a method of manufacturing a semiconductor device, the method includes forming a pillar on a base layer, forming a insulating layer on the base layer to cover the pillar by using GCIB method, where a lowermost portion of an upper surface of the insulating layer is lower than an upper surface of the pillar, and polishing the insulating layer and the pillar to expose a head of the pillar by using CMP method, where an end point of the polishing is the lowermost portion of the upper surface of the insulating layer.

16 Claims, 14 Drawing Sheets

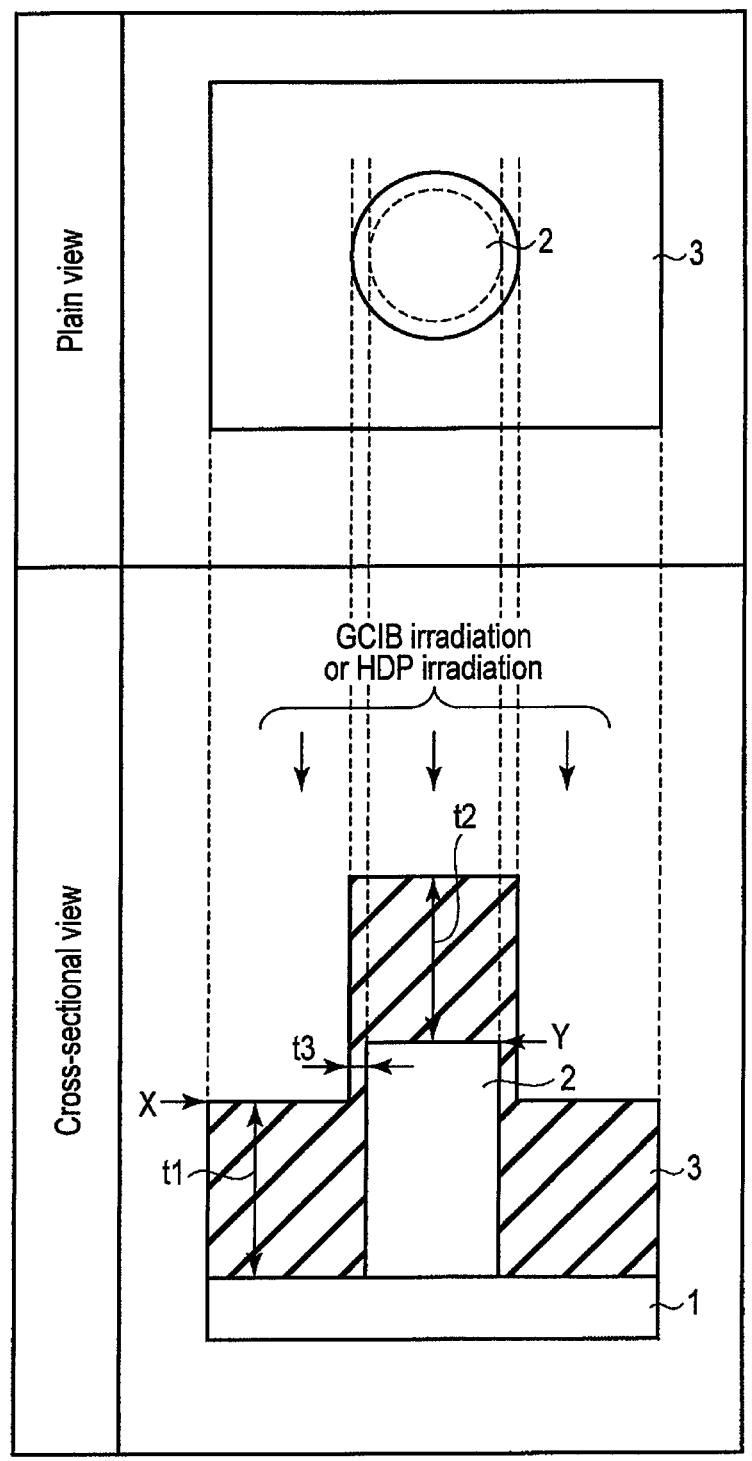
F I G. 3

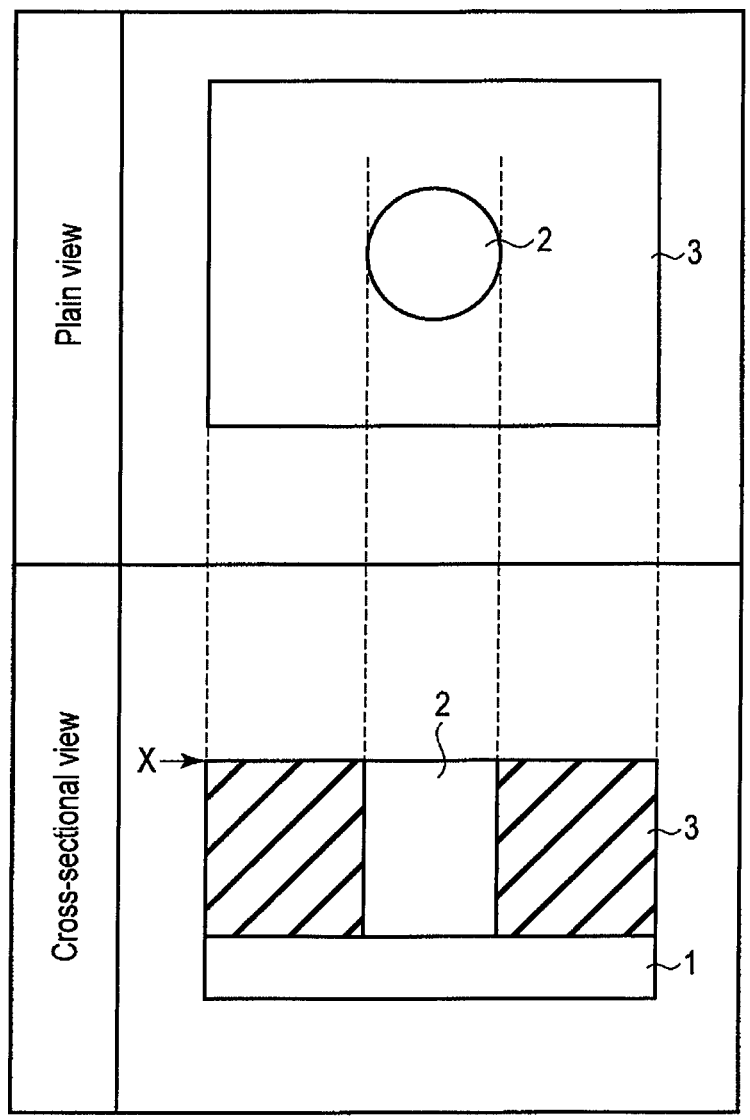
F I G. 4

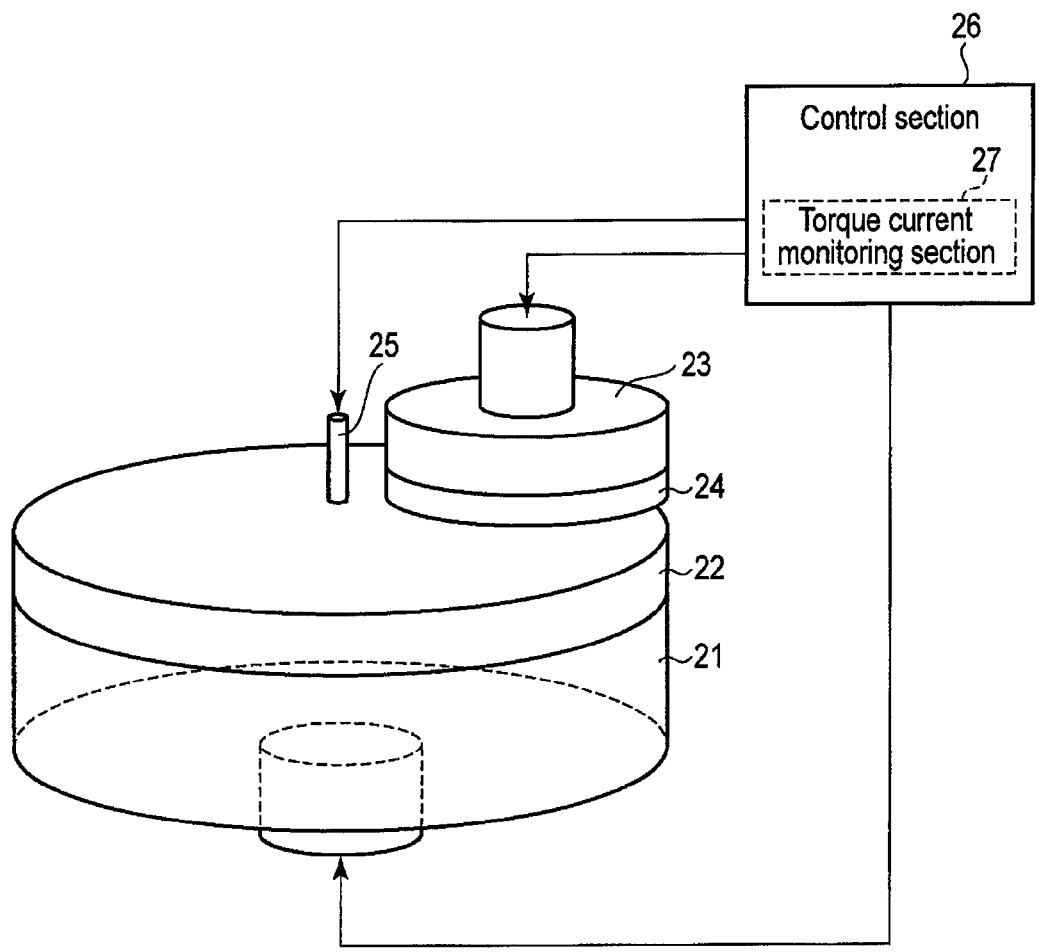
F I G. 5
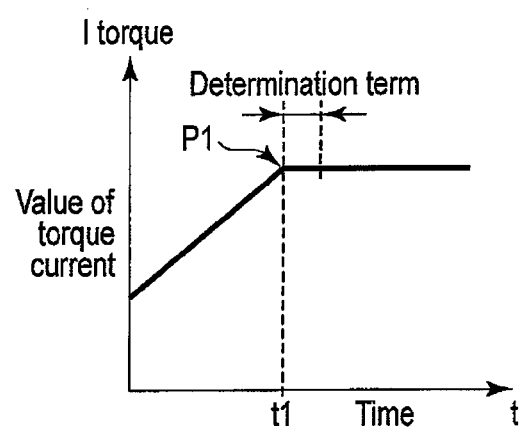
F I G. 6

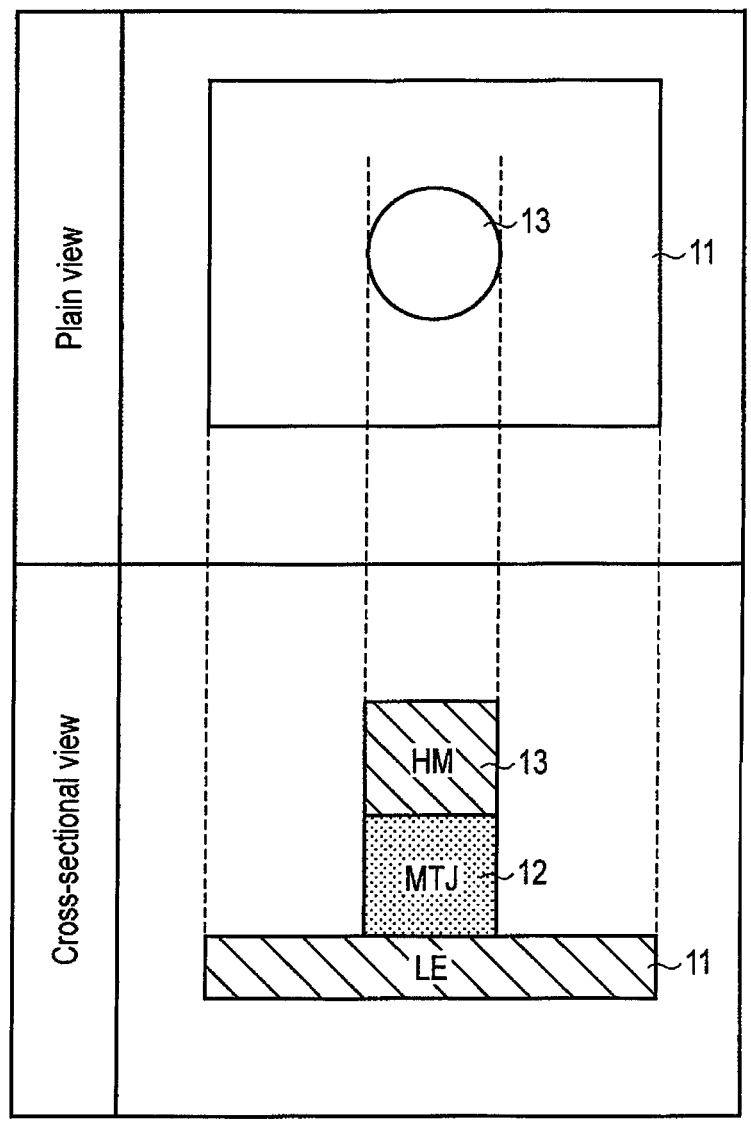
F I G. 8

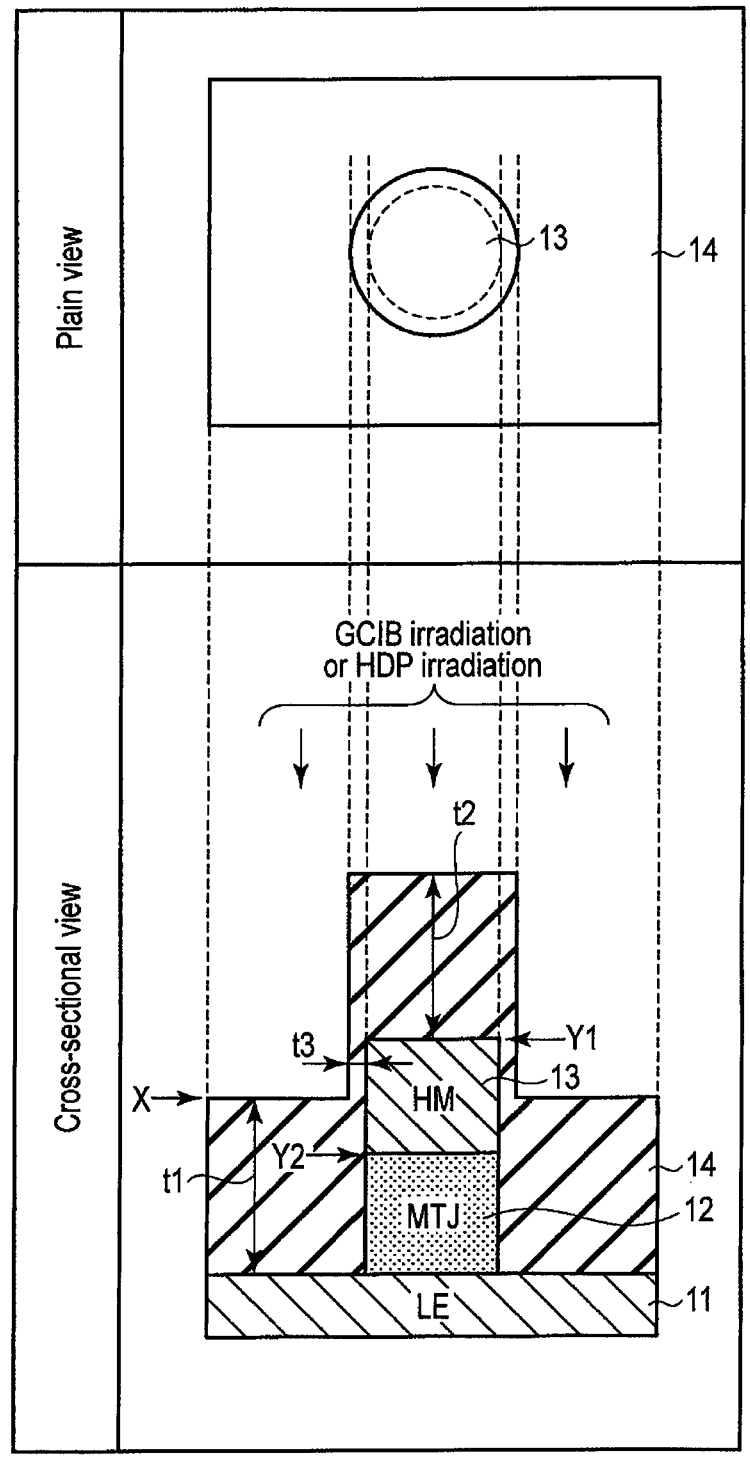
F I G. 9

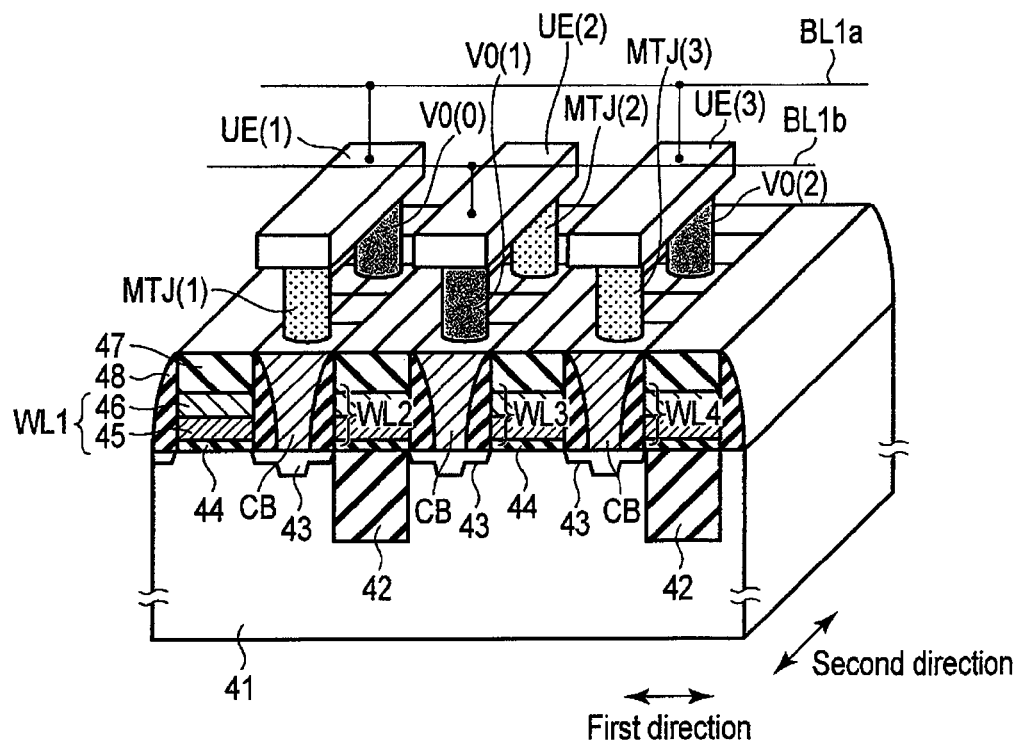
F I G. 13
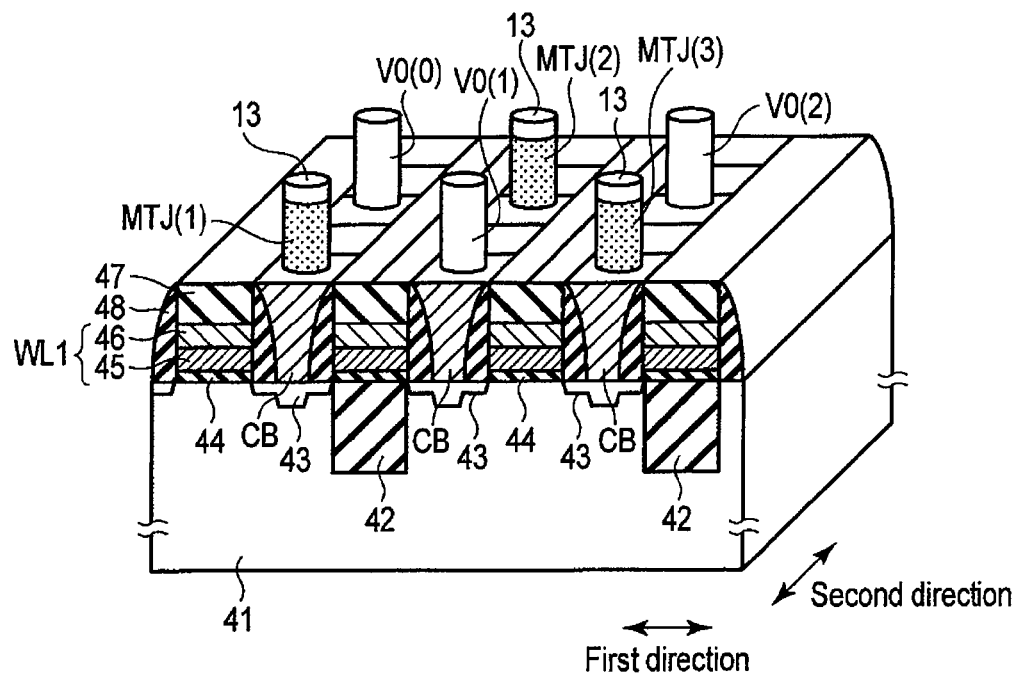
F I G. 14

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2011-146577, filed Jun. 30, 2011, the entire contents of which are incorporated herein by reference.

FIELD

Embodiments described herein relate generally to a method of manufacturing a semiconductor device.

BACKGROUND

A semiconductor device manufacturing method includes a process (pillar head exposing process) of exposing the upper surface of a pillar from an insulating layer after the pillar is formed on a base layer and buried in the insulating layer. The problem of this process is that the timing at which the upper surface of the pillar is exposed cannot be detected when exposing the upper surface of the pillar from the insulating layer by CMP (Chemical Mechanical Polishing) or etch back. Therefore, it is conventionally necessary to combine CMP, RIE (Reactive Ion Etching), IBE (Ion Beam Etching), and the like, or obtain an optimal etching time by verifying the relationship between the etching time of the insulating layer and the exposed state (the etching amount of the insulating layer) of the upper surface of the pillar by using samples.

BRIEF DESCRIPTION OF THE DRAWINGS

FIGS. 1 to 6 are views showing a basic process;
FIGS. 7 to 10 are views showing a process according to an embodiment;
FIGS. 12 and 13 are views showing a semiconductor memory as an application example;
and
FIGS. 14 to 17 are views showing a method of manufacturing the semiconductor memory shown in FIG. 13.

DETAILED DESCRIPTION

In general, according to one embodiment, a method of manufacturing a semiconductor device, the method comprising: forming a pillar on a base layer; forming an insulating layer on the base layer to cover the pillar by using GCIB method, where a lowermost portion of an upper surface of the insulating layer is lower than an upper surface of the pillar; and polishing the insulating layer and the pillar to expose a head of the pillar by using CMP method, where an end point of the polishing is the lowermost portion of the upper surface of the insulating layer.

An embodiment will be explained below with reference to the accompanying drawings.

1. BASIC PROCESS

FIGS. 1, 2, 3, 4, 5, and 6 illustrate a basic process.

This process relates to a process of exposing a head of a pillar. The pillar herein mentioned is a columnar member formed on a base layer, and is not limited to a single-layered structure/multilayered structure, a conductor (including a resistor)/semiconductor/insulator, and the like. The pillar can also include functional elements (e.g., a plug, electrode, and memory cell).

Figure 1:
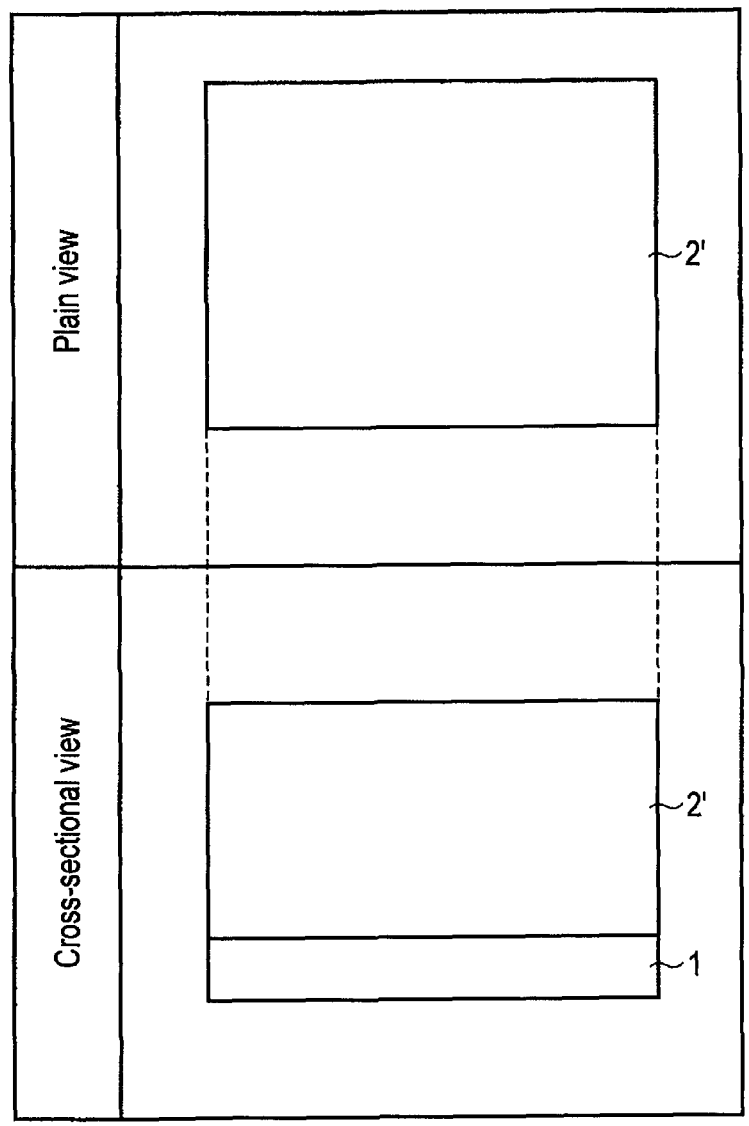

First, as shown in FIG. 1, second layer 2' is formed on first layer (base layer) 1. First and second layers 1 and 2' contain different materials, and the types of these materials are not particularly limited. Also, an interface layer thinner than first and second layers 1 and 2' can exist between them.

Figure 2:
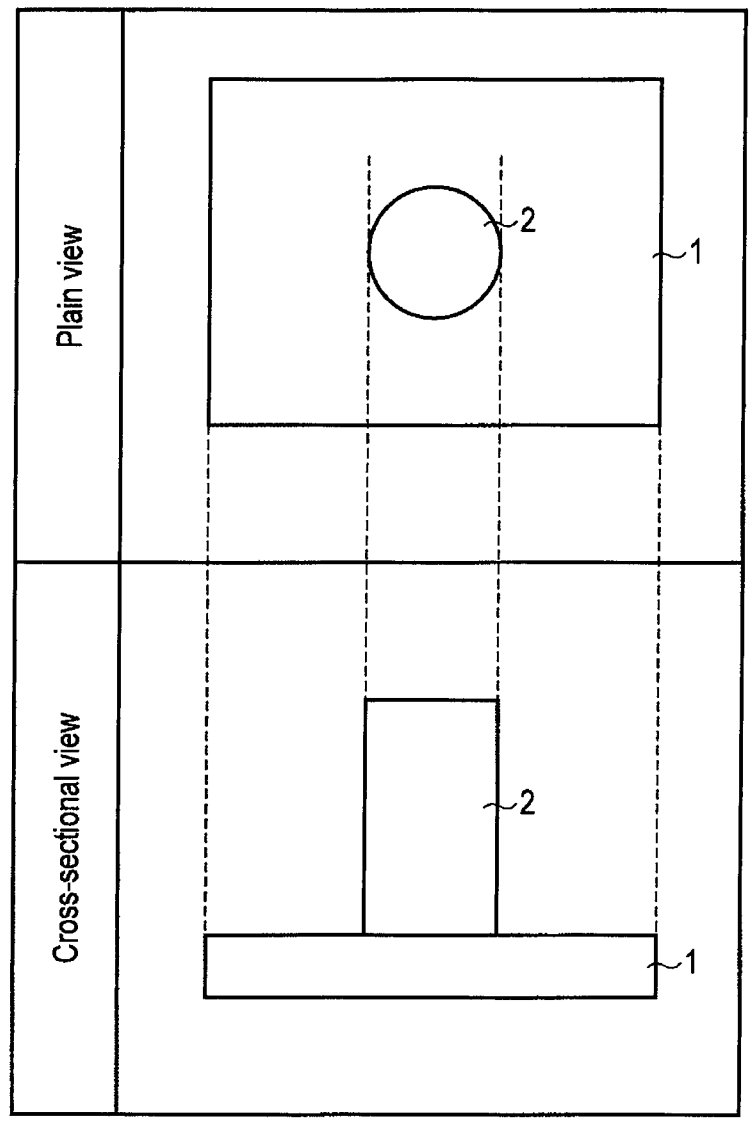

After that, pillar 2 is formed by patterning second layer 2' as shown in FIG. 2. The method of patterning is not particularly limited. For example, pillar 2 can be formed by anisotropic etching such as ion beam etching or RIE (Reactive Ion Etching) by using a hard mask.

Then, as shown in FIG. 3, insulating layer 3 covering pillar 2 and having an upper surface whose lowermost portion is lower than the upper surface of pillar 2 is formed on first layer 1 by using GCIB (Gas Cluster Ion Beam) method or HDP (High Density Plasma) method.

GCIB method is a method of ionizing a cluster containing elements, and irradiating the surface of a wafer with the ions, thereby performing etching or deposition.

For example, when a source gas at an atmospheric pressure level is released into a vacuum, the source gas adiabatically expands and decreases its temperature to about 1 K. Consequently, the source gas grows into a cluster having an atomic weight of about 10,000. When this cluster is ionized and the surface of a wafer is irradiated with the ions at an acceleration voltage, insulating layer 3 can be formed by GCIB method.

In GCIB method, the flow of the ionized cluster has strong directivity, so thicknesses t1 and t2 in the vertical direction of insulating layer 3 deposited on first layer 1 and pillar 2 are larger than thickness t3 in the horizontal direction of insulating layer 3 adhered on the sidewall of pillar 2. Note that the vertical direction and horizontal direction are perpendicular to each other.

The basic process uses GCIB method or HDP method to deposit insulating layer 3.

Also, lowermost portion X of the upper surface of insulating layer 3 deposited by GCIB method or HDP method, i.e., the bottom of the recess in insulating layer 3 is flatter than that of an insulating layer deposited by a conventional method such as CVD.

This facilitates control by which lowermost portion X of the upper surface of insulating layer 3 is made lower than upper surface Y of pillar 2. Especially when pillars are arranged into an array, spaces between the pillars are readily filled with insulating layer 3. When using GCIB method or HDP method, however, it is possible to perform control by which the spaces between the pillars are not completely filled with insulating layer 3.

Subsequently, as shown in FIG. 4, insulating layer 3 and pillar 2 are polished to lowermost portion X (corresponding to X shown in FIG. 3) of the upper surface of insulating layer 3 by using CMP. That is, lowermost portion X of the upper surface of insulating layer 3 formed by GCIB method or HDP method is used as the end point of CMP.

In the step shown in FIG. 3, lowermost portion X of the upper surface of insulating layer 3 is made lower than upper surface Y of pillar 2. When using lowermost portion X as the end point of CMP, therefore, the upper surface of pillar 2 can reliably be exposed from insulating layer 3.

This will be explained below.

FIG. 5 shows a CMP apparatus.

Pedestal (e.g., rotary table) 21 is, e.g., rotated (clockwise/counterclockwise). Polishing pad 22 is mounted on pedestal 21. Holder 23 holds wafer 24, and brings held wafer 24 into contact with the surface portion of polishing pad 22. Holder 23 is, e.g., rotated (clockwise/counterclockwise).

Supply portion 25 is formed above pedestal 21, e.g., above the center of a circle when pedestal 21 is a circular column, and supplies slurry to the surface portion of polishing pad 22. The slurry contains, e.g., a liquid chemical such as a polishing agent, and water. Control section 26 controls the operations of pedestal 21, holder 23, and supply portion 25.

Control section 26 includes torque current monitoring section 27.

Torque current monitoring section 27 is a means for determining the end point of CMP. That is, when pedestal 21 and holder 23 are respectively constantly rotated, the end point of CMP can be determined by monitoring the value of a torque current for rotating pedestal 21 or holder 23.

For example, as shown in FIG. 3, the upper surface of insulating layer 3 formed by GCIB method or HDP method has a projection and recess. In the initial stages of CMP, therefore, polishing pad 22 comes in contact with only the projection of the upper surface of insulating layer 3. That is, the contact resistance between polishing pad 22 and wafer 24 is small, and the torque current value is also small.

By contrast, as shown in, e.g., FIG. 6, the projection and recess of the upper surface of insulating layer 3 become small as the polishing time of CMP prolongs. As a consequence, the contact resistance between polishing pad 22 and wafer 24 gradually increases, and the torque current value also increases. The torque current value becomes maximum when the projection and recess of insulating layer 3 has disappeared, i.e., when the polishing amount of CMP has reached lowermost portion X of the upper surface of insulating layer 3, and remains almost constant after that.

Accordingly, the end point of CMP (lowermost portion X of the upper surface of insulating layer 3) can be determined by detecting change point P1 of the torque current value.

Note that, for example, a predetermined determination period is desirably set in order to detect change point P1 of the torque current value. The accuracy of the detection of the end point of CMP can be increased because, as described previously, lowermost portion X of the upper surface of insulating layer 3 deposited by GCIB method or HDP method is flat.

Note also that both pedestal 21 and holder 23 are preferably rotated in order to reduce the variation in polishing amount. When both pedestal 21 and holder 23 are rotated, the rotational directions of pedestal 21 and holder 23 are preferably the same.

In this basic process as described above, the TAT can be shortened because it is unnecessary to verify an optimum etching time (the polishing time of CMP) by using samples, unlike in the conventional processes.

Also, to protect pillar 2 against $H_2O$ or $O_2$, a general method is to separately form a thin protective layer (e.g., silicon nitride) and interlayer dielectric layer (e.g., silicon oxide) covering pillar 2. This method requires a process of forming the protective layer and a process of forming the interlayer dielectric layer. In addition, since a sufficiently thick interlayer dielectric layer remains above the pillar, a process of forming a contact hole reaching the upper surface of the pillar in the interlayer dielectric layer is also necessary. Consequently, the number of manufacturing steps increases, and this increases the manufacturing cost.

By contrast, in the basic process, insulating layer 3 formed by GCIB method or HDP method is an interlayer dielectric layer and can also function as a protective layer.

For example, when using a cluster containing $SiH_4$ and $N_2$, insulating layer 3 formed by GCIB method is silicon nitride. Also, when executing HDP method by using a gas containing $SiH_4$ and $N_2$, insulating layer 3 becomes silicon nitride. This silicon nitride can function as both an interlayer dielectric layer and a protective layer for protecting pillar 2.

Accordingly, the basic process can reduce the number of manufacturing steps of a semiconductor device, thereby reducing the manufacturing cost.

Note that it is unrealistic to form a sufficiently thick protective layer (e.g., silicon nitride) by a conventional deposition method (e.g., CVD), and cause the protective layer to function as an interlayer dielectric layer as well. This is so because the sufficiently thick protective layer remains on the pillar if a conventional process is used.

In the basic process, however, the interlayer dielectric layer as the protective layer is exclusively formed between pillars 2, and is not formed on pillars 2.

Note that GCIB method may also be used in the patterning process shown in FIG. 2.

That is, GCIB method is also applicable as an etching method. In this case, the formation of pillar 2 shown in FIG. 2 and the deposition of insulating layer 3 shown in FIG. 3 can be performed in the same apparatus. This makes it possible to prevent pillar 2 from being, e.g., damaged or oxidized by wafer transportation.

Furthermore, the upper surface of pillar 2 can also be exposed from insulating layer 3 by using GCIB method, instead of the CMP process shown in FIG. 4. That is, GCIB method is also effective as selective etching (lateral etching) of projections.

Accordingly, when, for example, all the processes shown in FIGS. 2, 3, and 4 are performed by GCIB, it is possible to prevent pillar 2 from being, e.g., damaged or oxidized, and reduce the manufacturing cost.

As explained above, the basic process can shorten the TAT and reduce the manufacturing cost in the process of exposing the head of a pillar in a semiconductor device manufacturing method.

2. EMBODIMENT

FIGS. 7, 8, 9, and 10 illustrate the head exposing process of a resistance change element.

The resistance change element herein mentioned is a memory cell that changes the resistance value in accordance with, e.g., an electric current, voltage, heat, or magnetic field. Examples of a semiconductor memory using the resistance change element as a memory cell are an MRAM (Magnetic Random Access Memory) using a magnetoresistive effect element as a memory cell, and a ReRAM (Resistive Random Access Memory) using a metal oxide as a memory cell.

Note that when the pillar includes the resistance change element (e.g., the magnetoresistive effect element), the dielectric constant of the material filled between the pillars, i.e., the inter-pillar capacitance has no influence on the performance of the resistance change element. As explained in the basic process, therefore, even when silicon nitride having the function of a protective layer is used as the interlayer dielectric layer, the interlayer dielectric layer filled only between the pillars 2 has no adverse effect on the performance of the resistance change element.

Figure 7:
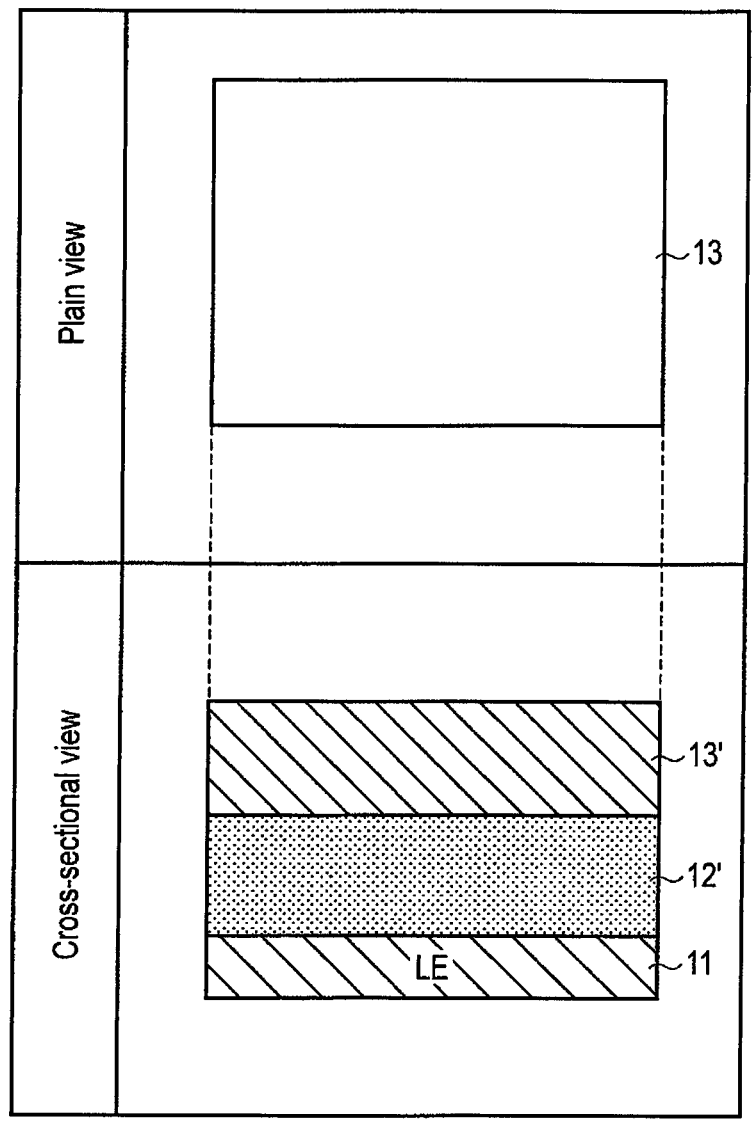

First, as shown in FIG. 7, memory cell material layer (multilayered structure) 12' is formed on lower electrode (LE) 11. Also, hard mask material layer 13' is formed on memory cell material layer 12'.

After that, a resist pattern is formed by using, e.g., PEP (Photo Engraving Process), and the hard mask material layer 13' is patterned by anisotropic etching such as ion beam etching or RIE by using the resist pattern as a mask, thereby forming a hard mask layer. The resist pattern is then removed.

Subsequently, the hard mask layer is used as a mask to pattern memory cell material layer 12' by physical etching such as GCIB etching. In this step, the hard mask layer is used as a mask because if memory cell material layer 12' is etched by using a resist pattern as a mask, memory cell material layer 12' is oxidized when the resist pattern is removed by ashing.

As a result of the patterning described above, as shown in FIG. 8, a pillar including resistance change element (MTJ) 12 and hard mask layer (HM) 13 is formed on lower electrode (LE) 11.

Then, as shown in FIG. 9, insulating layer 14 is formed on lower electrode 11 by using GCIB method or HDP method. Insulating layer 14 covers the pillar (resistance change element 12 and hard mask layer 13), and lowermost portion X of the upper surface of insulating layer 14 is lower than upper surface Y1 of hard mask layer 13 and higher than lower surface Y2 of hard mask layer 13.

In this embodiment, "the lowermost portion of the upper surface of insulating layer 14 formed by GCIB method or HDP method is higher than the lower surface of hard mask layer 13" is added as a condition not included in the basic process. This condition prevents resistance change element 12 from being etched when exposing the head of the pillar.

Also, the condition "the lowermost portion of the upper surface of insulating layer 14 is lower than the upper surface of hard mask layer 13" is equivalent to the condition "the lowermost portion of the upper surface of insulating layer 14 is lower than the upper surface of the pillar".

In GCIB method or HDP method, thicknesses t1 and t2 in the vertical direction of insulating layer 14 deposited on lower electrode 11 and hard mask layer 13 are larger than thickness t3 in the horizontal direction of insulating layer 14 adhered on the sidewall of hard mask layer 13. This facilitates control by which lowermost portion X of the upper surface of insulating layer 14 is made lower than upper surface Y1 of hard mask layer 13 and higher than lower surface Y2 of hard mask layer 13.

Figure 10:
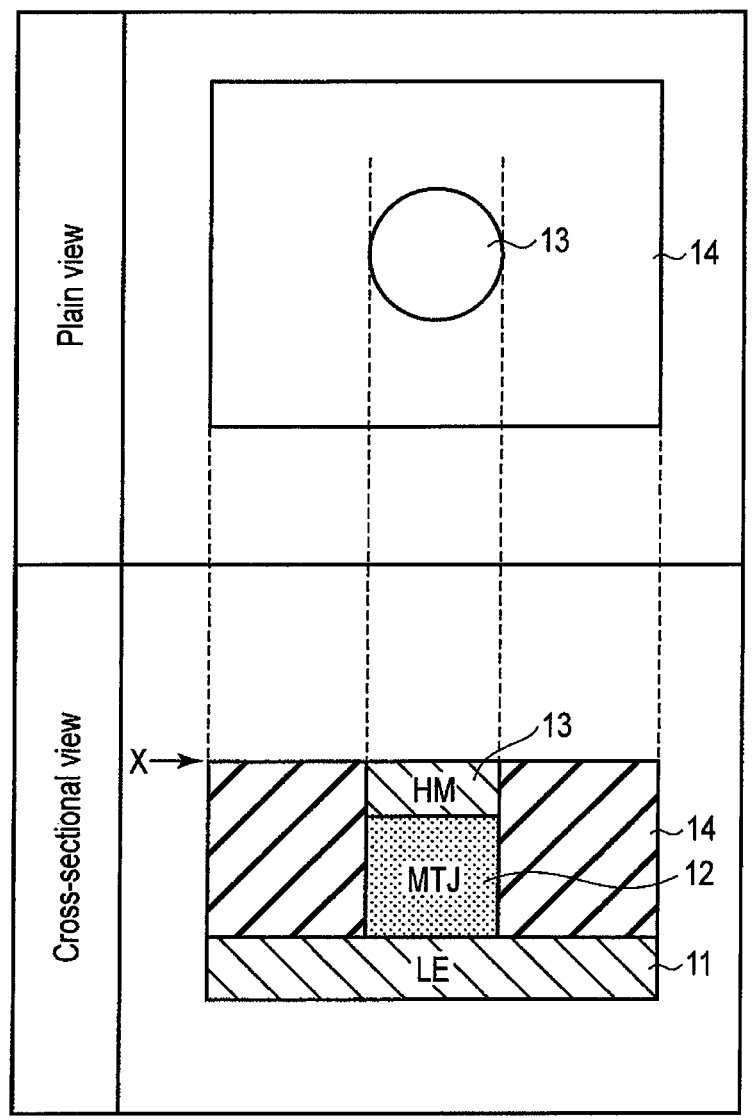

As shown in FIG. 10, insulating layer 14 and hard mask layer 13 are polished to lowermost portion X (corresponding to X shown in FIG. 9) of the upper surface of insulating layer 14 by using CMP. That is, as explained in the basic process, lowermost portion X of the upper surface of insulating layer 14 formed by GCIB is used as the end portion of CMP.

In the step shown in FIG. 9, lowermost portion X of the upper surface of insulating layer 14 is made lower than upper surface Y1 of hard mask layer 13 and higher than lower surface Y2 of hard mask layer 13. When using lowermost portion X as the end point of CMP, therefore, the upper surface of hard mask layer 13 can reliably be exposed from insulating layer 14.

Note that the upper surface of hard mask layer 13 can also be exposed from insulating layer 14 by using lateral etching performed by GCIB method, instead of CMP.

The process of exposing the head of the resistance change element is completed by the above-mentioned steps.

Note that insulating layer 14 can be deposited at a low temperature by GCIB method when compared to CVD or ALD. For example, while a temperature of 400° C. to 600° C. is necessary in CVD or ALD, GCIB method can be performed at room temperature. Therefore, there is no adverse effect on resistance change element 12 while insulating layer 14 is deposited by GCIB method.

Figure 11:
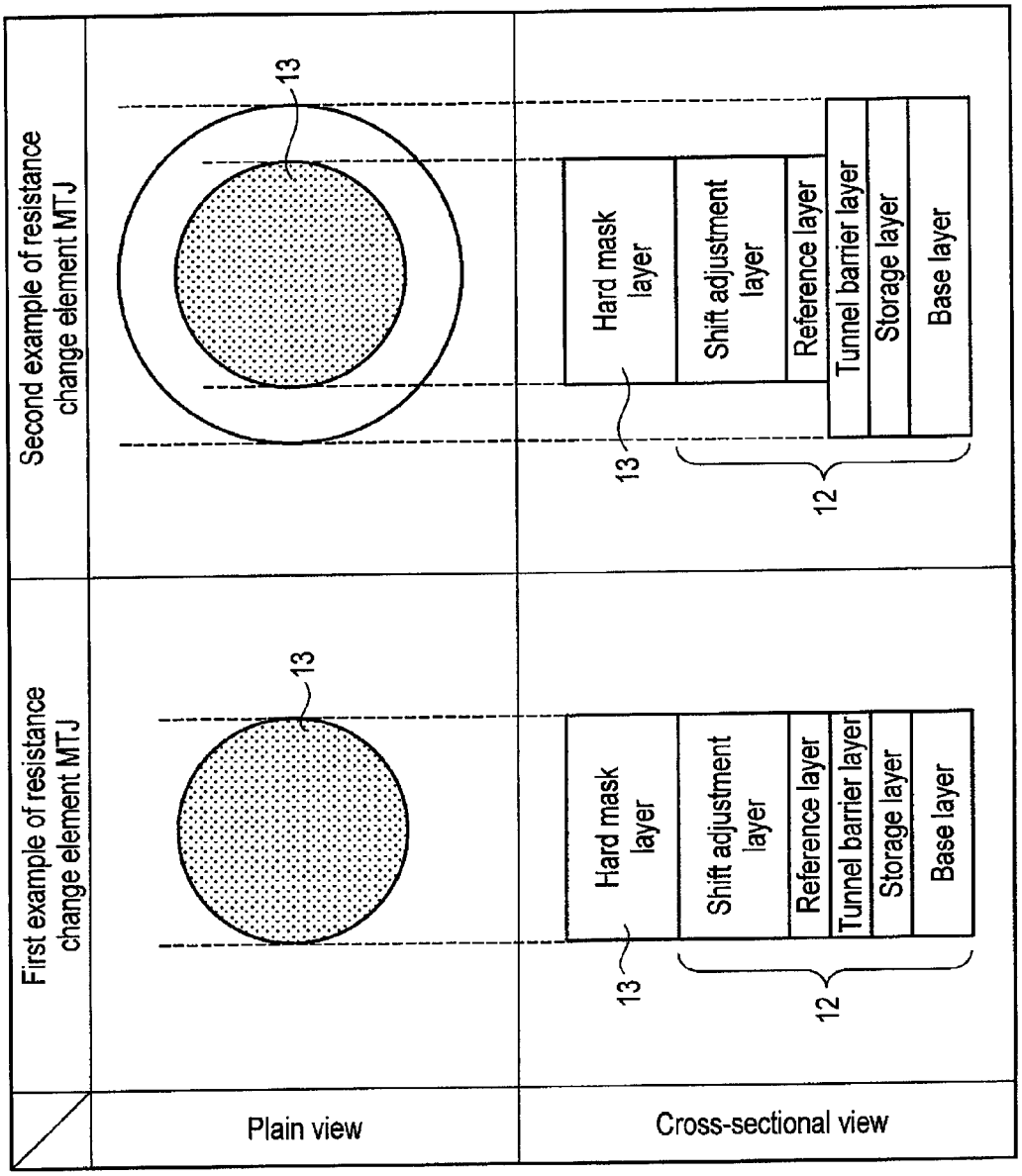
FIG. 11 is a view showing an example of a resistance change element.

FIG. 11 shows an example of the resistance change element.

Resistance change element (MTJ) 12 is, e.g., a magnetoresistive effect element.

In this example, resistance change element 12 includes a base layer, a storage layer (magnetic free layer) on the base layer, a tunnel barrier layer on the storage layer, a reference layer (magnetic pinned layer) on the tunnel barrier layer, and a shift adjustment layer on the reference layer.

Hard mask layer 13 is formed on resistance change element 12.

The storage layer and reference layer contain, e.g., CoFeB, and the tunnel barrier layer contains, e.g., MgO. The shift adjustment layer contains, e.g., one of Pt, Pd, and Ir. Hard mask layer 13 contains, e.g., one of TiN and TaN.

The shift adjustment layer has a function of adjusting the shift of the magnetic hysteresis curve of the magnetic free layer, which is caused by the structure of the magnetoresistive layer. The shift adjustment layer achieves its function when added to the magnetic pinned layer.

The difference between the first and second examples is the relationship between the planar sizes of the storage layer and reference layer.

That is, in the first example, the storage layer and reference layer in resistance change element 12 have the same planar size. Also, this example includes a structure in which the sidewalls of the storage layer and reference layer are tapered downward. In this structure, the storage layer and reference layer have different planar sizes, and the sidewalls of the storage layer and reference layer obliquely continuously change.

In the second example, the planar sizes of the storage layer and reference layer in resistance change element 12 are different. "The planar sizes are different" in this example means that the sidewalls of the storage layer and reference layer are discontinuous.

The feature of the second example is the ability to prevent an electrical shortcircuit between the storage layer and reference layer, which is caused by a re-deposition layer formed when patterning resistance change element 12.

Note that the plain view (planar shape) of resistance change element MTJ has a circular shape in this embodiment, but the present invention is not limited to this. The planar shape of resistance change element MTJ may also be square or a shape close to an ellipse.

3. APPLICATION EXAMPLE

Recently, a magnetic random access memory (MRAM) using the tunneling magneto resistive (TMR) effect has been developed as a nonvolatile semiconductor memory. The MRAM has features that high-speed read/write and a low-power-consumption operation can be performed and the capacity can be increased, and hence is expected as a next-generation working memory.

A memory cell of the MRAM is a magnetoresistive effect element. Recently, a so-called, spin transfer torque method using the spin-momentum-transfer (SMT) phenomenon is most frequently used to reverse magnetization in the storage layer of the magnetoresistive effect element. This method can achieve the scalability that a magnetization reversing current decreases as the size of the magnetoresistive effect element decreases. Accordingly, the method is desirable for large-capacity memories in the future.

Also, the spin transfer torque method is particularly effective when the storage layer and reference layer have perpendicular magnetization. This is so because the magnetoresistive effect element can be downsized regardless of its shape. If the storage layer and reference layer have in-plane magnetization, magnetic shape anisotropy must be given to the magnetoresistive effect element, and this is undesirable for downsizing.

"Perpendicular magnetization" herein mentioned means that the direction of residual magnetization is perpendicular or almost perpendicular to the film surfaces (upper surface/lower surface) of the storage layer and reference layer. In this specification, "almost perpendicular" means that the direction of residual magnetization falls within the range of $45°<\theta\leq90°$.

An example in which the resistance change element (magnetoresistive effect element) manufacturing method according to the embodiment is applied to the MRAM will be explained below.

Figure 12:
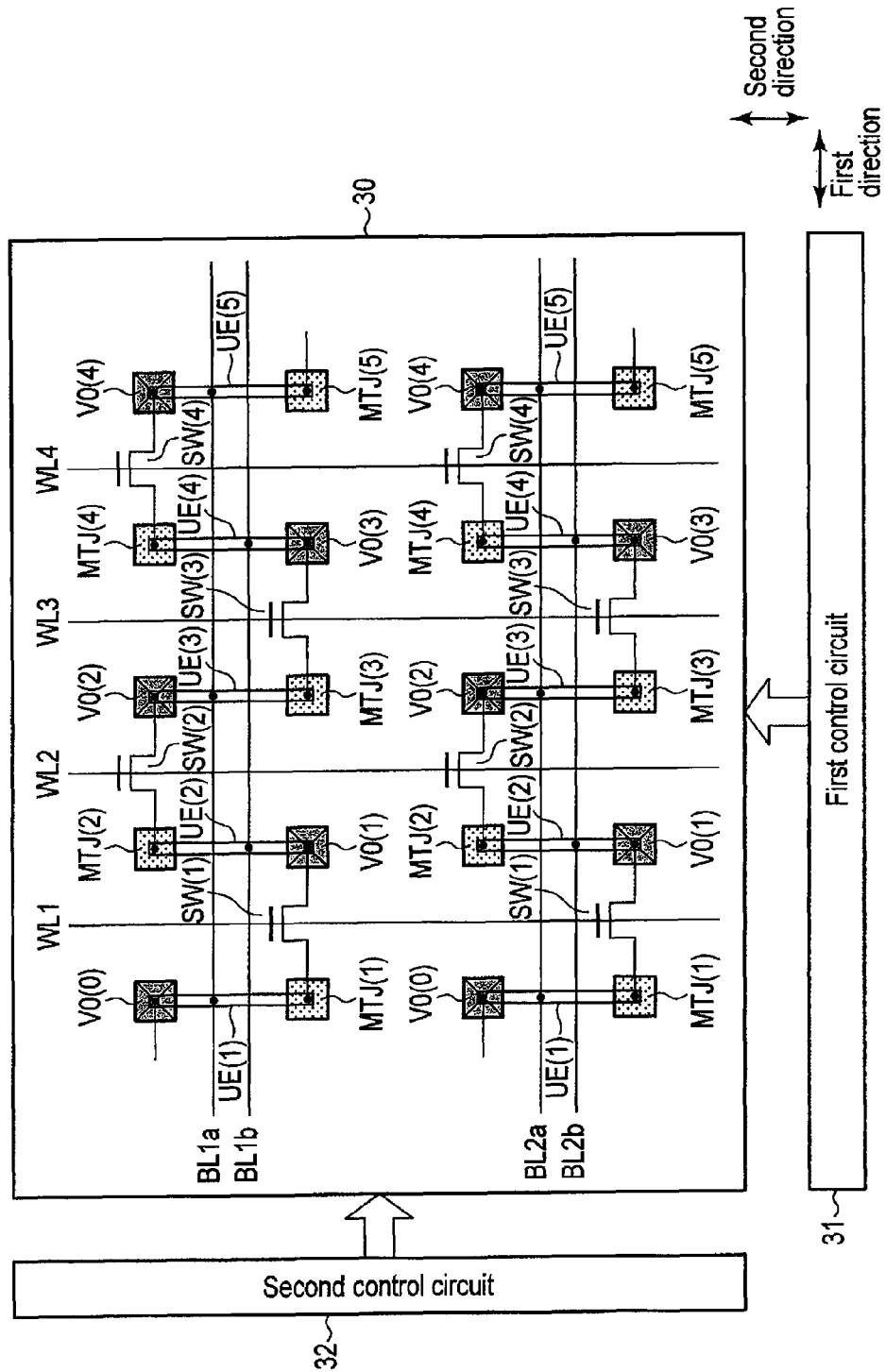

FIG. 12 shows an example of the memory cell array of the MRAM.

Memory cell array 30 includes magnetoresistive effect elements MTJ(1) to MTJ(5), vias V0(0) to V0(4), and FETs SW(1) to SW(4).

Magnetoresistive effect elements MTJ(1) to MTJ(5) and vias V0(0) to V0(4) are alternately arranged in a first direction and a second direction perpendicular to the first direction.

Also, magnetoresistive effect elements MTJ(1) to MTJ(5) are arranged into a lattice shape at a predetermined pitch when only elements MTJ(1) to MTJ(5) are viewed. Likewise, vias V0(0) to V0(4) are arranged into a lattice shape at a predetermined pitch when only vias V0(0) to V0(4) are viewed.

Similar to magnetoresistive effect elements MTJ(1) to MTJ(5) and vias V0(0) to V0(4), FETs SW(1) to SW(4) are arranged into a lattice shape. Each FET is connected between one magnetoresistive effect element and one via adjacent to each other in the first direction.

For example, FET SW(1) is connected between magnetoresistive effect element MTJ(1) and via V0(1) adjacent to each other in the first direction, among magnetoresistive effect elements MTJ(1) to MTJ(5) and vias V0(0) to V0(4). FET SW(2) is connected between magnetoresistive effect element MTJ(2) and via V0(2) adjacent to each other in the first direction, among magnetoresistive effect elements MTJ(1) to MTJ(5) and vias V0(0) to V0(4).

Word lines WL1, WL2, WL3, WL4, . . . run in the second direction, and are connected to the gates of FETs arranged in the second direction.

For example, word line WL1 is connected to the gate of FET SW(1), and word line WL2 is connected to the gate of FET SW(2).

Each of upper electrodes UE(1) to UE(5) is connected to one magnetoresistive effect element and one via adjacent to each other in the second direction.

For example, upper electrode UE(1) is connected to via V0(0) and magnetoresistive effect element MTJ(1). Upper electrode UE(2) is connected to via V0(1) and magnetoresistive effect element MTJ(2). Upper electrode UE(3) is connected to via V0(2) and magnetoresistive effect element MTJ(3).

Bit lines BL1a, BL1b, BL2a, BL2b, . . . run in the first direction, and are connected to alternate ones of upper electrodes UE(1) to UE(5) arranged in the first direction.

For example, bit lines BL1a and BL2a are connected to odd-numbered upper electrodes UE(1), UE(3), and UE(5). Bit lines BL1b and BL2b are connected to even-numbered upper electrodes UE(2) and UE(4).

First control circuit 31 controls the potentials of word lines WL1, WL2, WL3, WL4, . . . . Second control circuit 32 controls the potentials of bit lines BL1a, BL1b, BL2a, BL2b, . . . .

For example, when performing read/write to magnetoresistive effect element MTJ(1), first control circuit 31 is used to set the potential of word line WL1 at "H", and the potentials of other word lines WL2, WL3, WL4, . . . at "L". "H" is a potential for turning on the FET, and "L" is a potential for turning off the FET.

In this state, read/write to magnetoresistive effect element MTJ(1) can be performed by controlling the potentials of bit lines BL1a, BL1b, BL2a, BL2b, . . . by using second control circuit 32.

FIG. 13 shows an example of the device structure of the memory cell array shown in FIG. 12.

Element isolation insulating layers 42 having an STI (Shallow Trench Isolation) structure are formed in semiconductor substrate 41. Source/drain diffusion layers 43 are formed in active areas surrounded by element isolation insulating layers 42.

Gate insulating layer 44, conductive silicon layer 45, metal layer 46, and hard mask layer 47 are formed on each channel region between source/drain diffusion layers 43. Metal layer 46 contains, e.g., metal silicide. Metal layer 46 can be either a single layer or multiple layers. Hard mask layer 47 is, e.g., an insulating layer.

Conductive silicon layers 45 and metal layers 46 function as the gates of FETs, and also function as word line WL1, WL2, WL3, WL4, . . . as they extend in the second direction. Sidewall insulating layers 48 for forming contacts with source/drain diffusion layers 43 by self-alignment are formed on the sidewalls of gate insulating layers 44, conductive silicon layers 45, metal layers 46, and hard mask layers 47.

Contact vias (plugs) CB are formed on source/drain diffusion layers 43. Magnetoresistive effect elements MTJ(1), MTJ(2), MTJ(3), . . . and vias V0(0), V0(1), V0(2), . . . are formed on contact vias CB. Upper electrodes UE(1), UE(2), UE(3), . . . are formed on magnetoresistive effect elements MTJ(1), MTJ(2), MTJ(3), . . . and vias V0(0), V0(1), V0(2), . . . .

Next, a method of manufacturing the MRAM shown in FIG. 13 will be explained.

First, as shown in FIG. 14, element isolation insulating layers 42 are formed in semiconductor substrate 41, and FETs are formed on semiconductor substrate 41. Each FET includes source/drain diffusion layers 43, gate insulating layer 44, conductive silicon layer 45, metal layer 46, hard mask layer 47, and sidewall insulating layer 48.

In addition, contact vias CB are formed on source/drain diffusion layers 43 by self-alignment, and magnetoresistive effect elements MTJ(1), MTJ(2), MTJ(3), . . . and vias V0(0), V0(1), V0(2), . . . are formed on contact vias CB. Each of magnetoresistive effect elements MTJ(1), MTJ(2), MTJ(3), . . . and vias V0(0), V0(1), V0(2), . . . has a pillar shape.

Also, magnetoresistive effect elements MTJ(1), MTJ(2), MTJ(3), . . . are desirably patterned by physical etching (e.g., GCIB etching) by using hard mask layer 13 as a mask.

Figure 15:
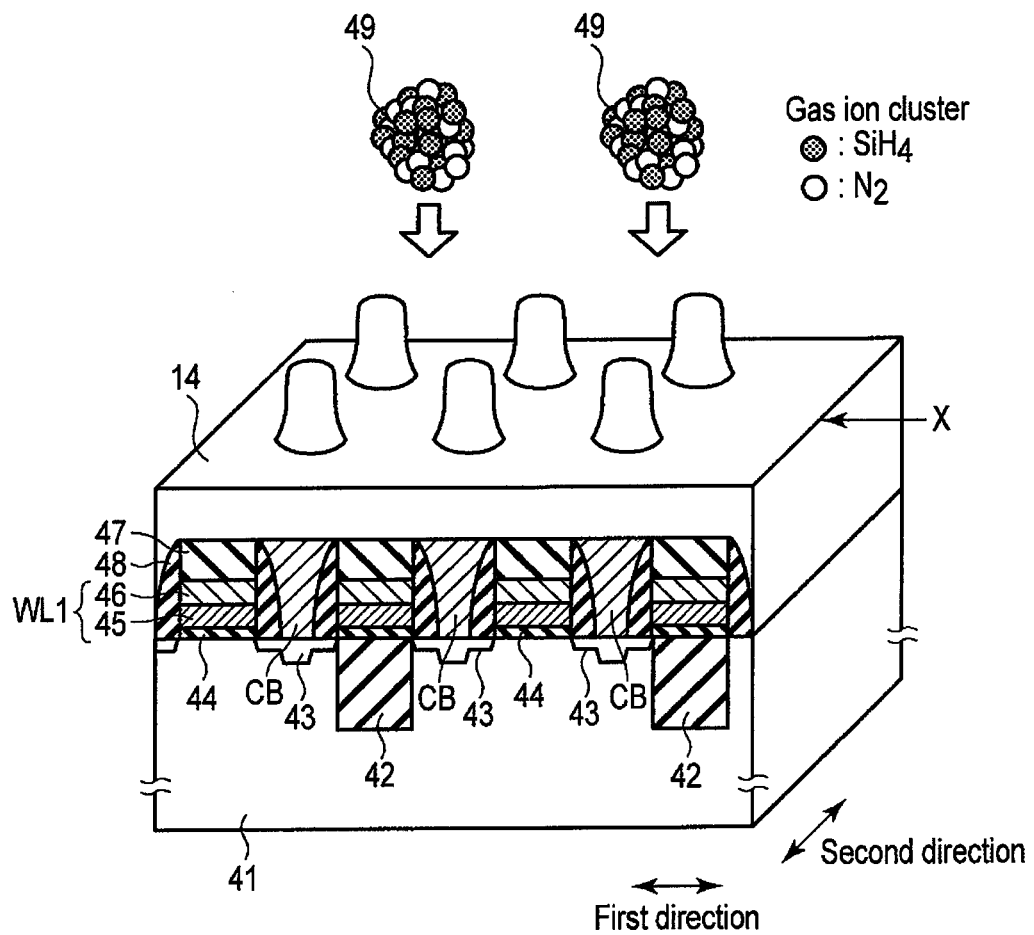

Then, as shown in FIG. 15, insulating layer 14 is formed on the FETs by using GCIB method or HDP method. Insulating layer 14 covers the pillars (magnetoresistive effect elements MTJ(1), MTJ(2), MTJ(3), . . . and vias V0(0), V0(1), V0(2), . . . ), and lowermost portion X of the upper surface of insulating layer 14 is lower than the upper surface of hard mask layer 13 (see FIG. 14) and higher than the lower surface of hard mask layer 13 (see FIG. 14).

A process when insulating layer 14 is formed by GCIB method and made of silicon nitride will be explained below.

First, $SiH_4$ gas and $N_2$ gas at an atmospheric pressure level are released into a vacuum chamber. These gases adiabatically expand and are cooled to about 1 K. Consequently, gas ion clusters 49 having an atomic weight of about 10,000 are formed. Clusters 49 are then ionized, and a predetermined acceleration voltage is applied to clusters 49, thereby irradiating the surface of a wafer with clusters 49.

This irradiation with clusters 49 forms thick insulating layer 14 on the upper surfaces of FETs and pillars, and thin insulating layer 14 on the sidewalls of the pillars. Accordingly, the upper surface of insulating layer 14 has projections and recesses. Note that the projections of insulating layer 14 correspond to the positions of the pillars.

Insulating layer 14 is not limited to silicon nitride and may also be silicon oxide.

When using silicon oxide as insulating layer 14, $SiH_4$ and $O_2$ gas at an atmospheric pressure level need only be released into a vacuum chamber.

Figure 16:
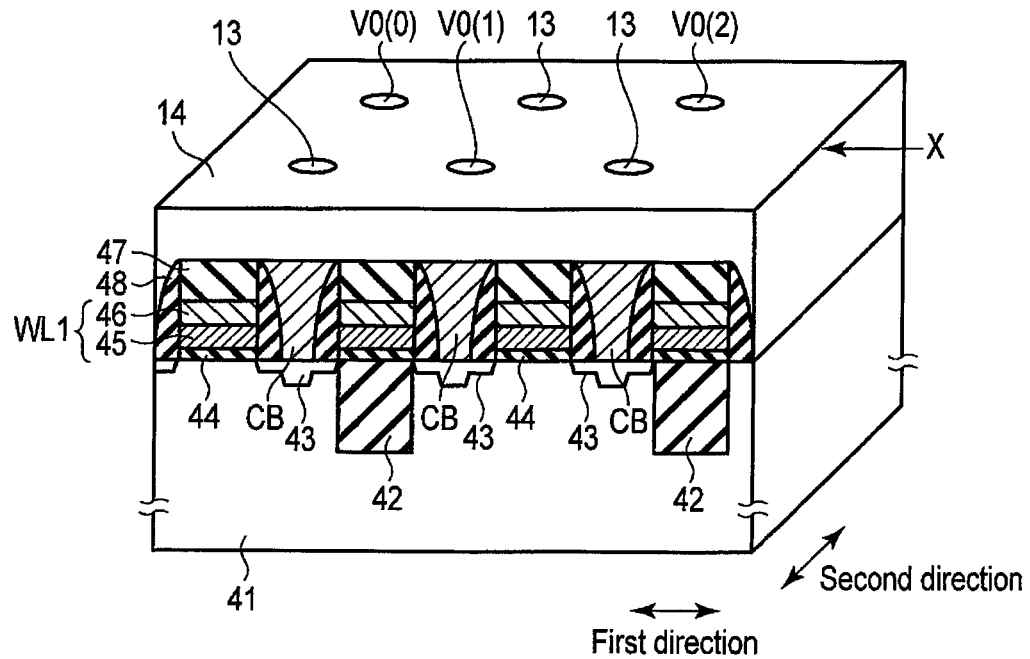
Figure 17:
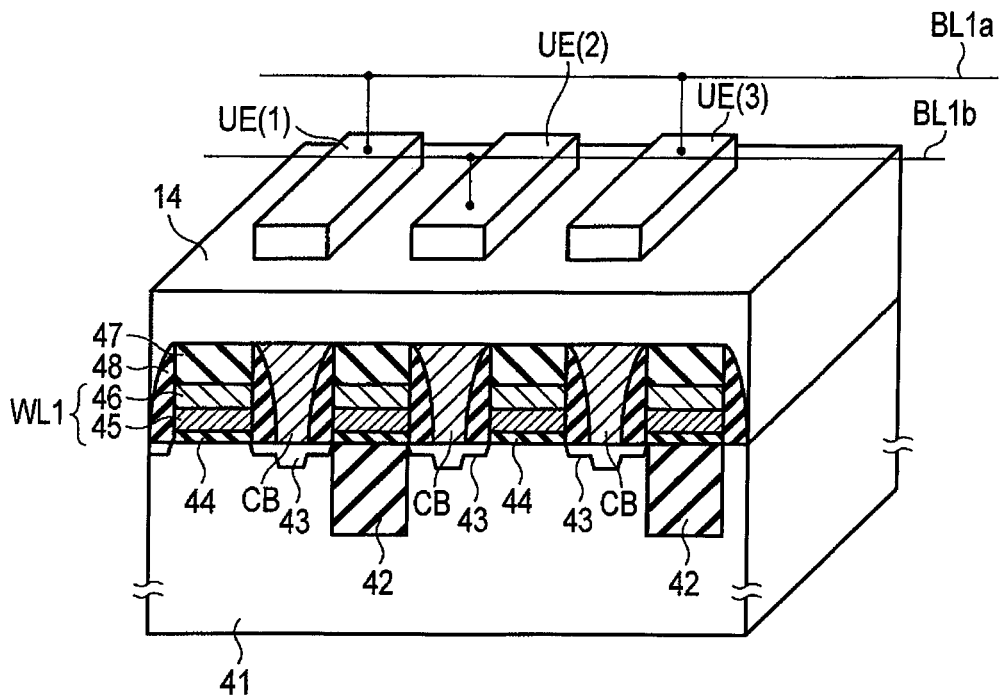

Then, as shown in FIG. 16, insulating layer 14 is polished to lowermost portion X (corresponding to X shown in FIG. 15) of the upper surface of insulating layer 14 by using CMP. That is, as explained in the basic process, lowermost portion X of the upper surface of insulating layer 14 formed by GCIB method is used as the end point of CMP.

As a consequence, the upper surfaces of hard mask layers 13 and the upper surfaces of vias V0(0), V0(1), V0(2), . . . are exposed from insulating layer 14.

Note that the upper surfaces of hard mask layers 13 and the upper surfaces of vias V0(0), V0(1), V0(2), . . . can also be exposed from insulating layer 14 by using GCIB method, instead of CMP.

Finally, one hard mask layer 13 and one of vias V0(0), V0(1), V0(2), . . . adjacent to each other in the second direction are electrically connected by a corresponding one of upper electrodes UE(1), UE(2), UE(3), . . . .

In addition, bit line BL1a to be connected to upper electrodes UE(1), UE(3), . . . is formed, and bit line BL1b to be connected to upper electrodes UE(2), . . . is formed.

The MRAM shown in FIG. 13 is formed by the above steps.

4. CONCLUSION

The embodiment can shorten the TAT and reduce the manufacturing cost.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
   forming a pillar on a base layer;
   forming an insulating layer on the base layer to cover the pillar by using GCIB method, where a lowermost portion of an upper surface of the insulating layer is lower than an upper surface of the pillar; and
   polishing the insulating layer and the pillar to expose a head of the pillar by using CMP method, where an end point of the polishing is the lowermost portion of the upper surface of the insulating layer,
   wherein the pillar comprises a memory cell on the base layer, and a hard mask layer on the memory cell,
   wherein after the forming the insulating layer and before the polishing the insulating layer and the pillar, the lowermost portion of the upper surface of the insulating layer is higher than a lower surface of the hard mask layer, and is lower than an upper surface of the hard mask layer.

2. The method of claim 1, wherein after the forming the insulating layer and before the polishing the insulating layer and the pillar, a thickness in a vertical direction of the insulating layer on the base layer is larger than a thickness in a horizontal direction perpendicular to the vertical direction of the insulating layer on a sidewall of the pillar.

3. The method of claim 1, wherein the GCIB method is executed by using a cluster including $SiH_4$ and $N_2$.

4. The method of claim 1, wherein the pillar is patterned by GCIB method.

5. A method of manufacturing a semiconductor device, the method comprising:
   forming a pillar on a base layer;
   forming an insulating layer on the base layer to cover the pillar by using HDP method, where a lowermost portion of an upper surface of the insulating layer is lower than an upper surface of the pillar; and
   polishing the insulating layer and the pillar to expose a head of the pillar by using CMP method, where an end point of the polishing is the lowermost portion of the upper surface of the insulating layer,
   wherein the pillar comprises a memory cell on the base layer, and a hard mask layer on the memory cell,
   wherein after the forming the insulating layer and before the polishing the insulating layer and the pillar, the lowermost portion of the upper surface of the insulating layer is higher than a lower surface of the hard mask layer, and is lower than an upper surface of the hard mask layer.

6. The method of claim 5, wherein after the forming the insulating layer and before the polishing the insulating layer and the pillar, a thickness in a vertical direction of the insulating layer on the base layer is larger than a thickness in a horizontal direction perpendicular to the vertical direction of the insulating layer on a sidewall of the pillar.

7. The method of claim 5, wherein the HDP method is executed by using a gas including $SiH_4$ and $N_2$.

8. The method of claim 5, wherein the pillar is patterned by GCIB method.

9. A method of manufacturing a semiconductor device, the method comprising:
   forming a pillar on a base layer;
   forming an insulating layer on the base layer to cover the pillar by using GCIB method, where a lowermost portion of an upper surface of the insulating layer is lower than an upper surface of the pillar; and
   etching the insulating layer and the pillar to expose a head of the pillar by using GCIB method, where an end point of the polishing is the lowermost portion of the upper surface of the insulating layer,
   wherein the pillar comprises a memory cell on the base layer, and a hard mask layer on the memory cell,
   wherein after the forming the insulating layer and before the polishing the insulating layer and the pillar, the lowermost portion of the upper surface of the insulating layer is higher than a lower surface of the hard mask layer, and is lower than an upper surface of the hard mask layer.

10. The method of claim 9, wherein after the forming the insulating layer and before the polishing the insulating layer and the pillar, a thickness in a vertical direction of the insulating layer on the base layer is larger than a thickness in a horizontal direction perpendicular to the vertical direction of the insulating layer on a sidewall of the pillar.

11. The method of claim 9, wherein the GCIB method is executed by using a cluster including $SiH_4$ and $N_2$.

12. The method of claim 9, wherein the pillar is patterned by GCIB method.

13. A method of manufacturing a semiconductor device, the method comprising:

forming a pillar on a base layer;

forming an insulating layer on the base layer to cover the pillar by using HDP method, where a lowermost portion of an upper surface of the insulating layer is lower than an upper surface of the pillar; and polishing the insulating layer and the pillar to expose a head of the pillar by using GCIB method, where an end point of the polishing is the lowermost portion of the upper surface of the insulating layer, wherein the pillar comprises a memory cell on the base layer, and a hard mask layer on the memory cell, wherein after the forming the insulating layer and before the polishing the insulating layer and the pillar, the lowermost portion of the upper surface of the insulating layer is higher than a lower surface of the hard mask layer, and is lower than an upper surface of the hard mask layer.

14. The method of claim 13, wherein after the forming the insulating layer and before the polishing the insulating layer and the pillar, a thickness in a vertical direction of the insulating layer on the base layer is larger than a thickness in a horizontal direction perpendicular to the vertical direction of the insulating layer on a sidewall of the pillar.

15. The method of claim 13, wherein the HDP method is executed by using a gas including $SiH_4$ and $N_2$.

16. The method of claim 13, wherein the pillar is patterned by GCIB method.

* * * * *